United States Patent
Rotondaro

(10) Patent No.: US 6,638,877 B2
(45) Date of Patent: *Oct. 28, 2003

(54) ULTRA-THIN SIO$_2$ USING N$_2$O AS THE OXIDANT

(75) Inventor: Antonio L. P. Rotondaro, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/971,385

(22) Filed: Oct. 4, 2001

(65) Prior Publication Data

US 2002/0081862 A1 Jun. 27, 2002

Related U.S. Application Data

(60) Provisional application No. 60/245,877, filed on Nov. 3, 2000.

(51) Int. Cl.$^7$ ................................. H01L 21/31
(52) U.S. Cl. .................. 438/770; 438/261; 438/263; 438/287; 438/584; 438/773; 438/774
(58) Field of Search ................. 438/261, 263, 438/287, 584, 770, 773, 774

(56) References Cited

U.S. PATENT DOCUMENTS

| | | | | |
|---|---|---|---|---|
| 5,888,870 A | * | 3/1999 | Gardner et al. | 438/261 |
| 6,114,258 A | * | 9/2000 | Miner et al. | 438/216 |
| 6,159,866 A | * | 12/2000 | Gronet et al. | 438/769 |
| 6,316,343 B1 | * | 11/2001 | Wada et al. | 438/584 |
| 2002/0073925 A1 | * | 6/2002 | Noble et al. | |
| 2002/0081826 A1 | * | 6/2002 | Rotondaro et al. | |

FOREIGN PATENT DOCUMENTS

| | | | | |
|---|---|---|---|---|
| EP | 001204135 A2 | * | 5/2002 | H01L/21/316 |
| JP | 2000-91577 | * | 3/2000 | H01L/21/316 |

* cited by examiner

*Primary Examiner*—Kamand Cuneo
*Assistant Examiner*—Lisa Kilday
(74) *Attorney, Agent, or Firm*—Jacqueline J. Garner; W. James Brady, III; Frederick J. Telecky, Jr.

(57) ABSTRACT

N$_2$O is used as the oxidant for forming an ultra-thin oxide (14). The low oxidation efficiency of N$_2$O compared to O$_2$ allows the oxidation temperature to be raised to greater than 850° C. while maintaining the growth rate. A cold wall lamp heater rapid thermal process (RTP) tool limits reaction to the surface of the wafer (10). Hydrogen is preferably added to improve the electrical properties of the oxide (14).

13 Claims, 5 Drawing Sheets

ULTRA-THIN SIO₂ USING N₂O AS THE OXIDANT

This application claims priority under 35 USC §119(e)(1) of provisional application No. 60/245,877 filed Nov. 3, 2000.

FIELD OF THE INVENTION

The invention is generally related to the field of forming gate dielectrics for transistors in integrated circuits and more specifically to forming ultra-thin gate dielectrics.

BACKGROUND OF THE INVENTION

Presently, there is a great demand for shrinking semiconductor devices to provide an increased density of devices on the semiconductor chip that are faster and consume less power. The scaling of devices in the lateral dimension requires vertical scaling as well so as to achieve adequate device performance. This vertical scaling requires the effective electrical thickness of the gate dielectric to be reduced so as to provide the required device performance.

Silicon dioxide has been the preferred gate dielectric material. However, scaling the thickness of $SiO_2$ for gate dielectric applications has placed severe limitations on the oxidation process. Sub-angstrom uniformity across the wafer and thickness control are requirements for the advanced technologies that use these dielectrics. In order to be able to grow these layers on conventional furnaces, the process temperature has to be dropped to less than 850° C. and the oxidant, $O_2$, concentration has to be diluted. This results in the degradation of the electrical properties of the $SiO_2$ dielectric as a result of the presence of a thicker interfacial layer.

SUMMARY OF THE INVENTION

The invention is an ultra-thin oxide structure and method. $N_2O$ is used as the oxidant for forming the ultra-thin oxide. The low oxidation efficiency of $N_2O$ compared to $O_2$ allows the oxidation temperature to be raised to greater than 850° C. while maintaining a reduced growth rate. In a preferred embodiment, hydrogen is added to improve the electrical properties of the oxide. In another embodiment of the invention, a cold wall lamp heater rapid thermal process (RTP) tool is used to form the ultra-thin oxide.

An advantage of the invention is providing a uniform and controlled method for forming a high quality ultra-thin oxide.

This and other advantages will be apparent to those of ordinary skill in the art having reference to the specification in conjunction with the drawings.

DETAILED DESCRIPTION OF THE EMBODIMENTS

The invention will now be described in conjunction with forming a gate dielectric for a MOS transistor. It will be apparent to those of ordinary skill in the art having reference to the specification that the benefits of the invention may be applied generally to forming ultra-thin oxides.

In an embodiment of the invention, an ultra-thin (<23 Å) oxide is formed using $N_2O$. The low oxidation efficiency of $N_2O$ compared to $O_2$ allows the oxidation temperature to be raised to greater than 850° C. The temperature can be raised to 1200° C. Preferably, however, the temperature is kept below 1100° C. At these temperatures, the growth rate of the ultra-thin oxide is such that a controlled growth of 10 Å can be achieved.

Hydrogen is preferably added to the ambient to provide extra improvement in the electrical properties of the dielectric.

Preferably, a reduced pressure is used to form the ultra-thin oxide. A reduced pressure ensures optimum uniformity and controlled growth rates. For example, the pressure may be on the order of 10 Torr.

Figure 1A:
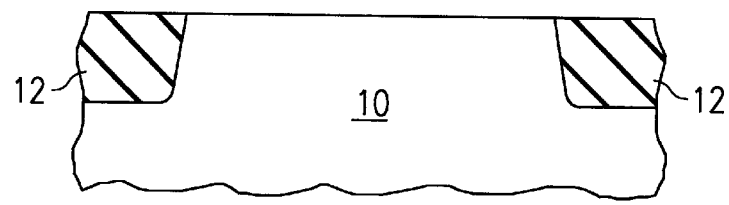
FIGS. 1A–1D are cross-sectional diagrams of a method for forming a transistor including an ultra-thin oxide according to the invention.

A process for forming a gate dielectric for a MOS transistor using an embodiment of the invention will now be discussed with reference to FIGS. 1A–1D. Referring to FIG. 1A, a semiconductor body 10 is processed through the formation of isolation structures 12. Semiconductor body 10 comprises a semiconductor substrate (e.g. silicon) with appropriate doping. For example, threshold adjust implants and any desired well regions (not shown) may have been formed. As shown, isolation structures 12 comprise shallow trench isolation. Alternative isolation structures, such as field oxide isolation, are known in the art.

Figure 1B:
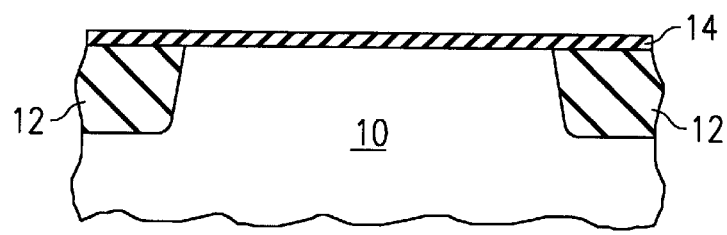

Referring to FIG. 1B, an ultra-thin gate dielectric 14 is formed over semiconductor body 10. Ultra-thin gate dielectric 14 comprises silicon-dioxide. The thickness of ultra-thin gate dielectric 14 is in the range of 7 Å–22 Å as measured by ellipsometry. The equivalent oxide thickness as measured by corona discharge extracted CV curves is in the range of 2 Å–22 Å. Ultra-thin gate dielectric 14 is formed using $N_2O$ as the oxidant. In the preferred embodiment, $H_2$ is added to the ambient to improve the electrical properties of dielectric 14.

Figure 2:
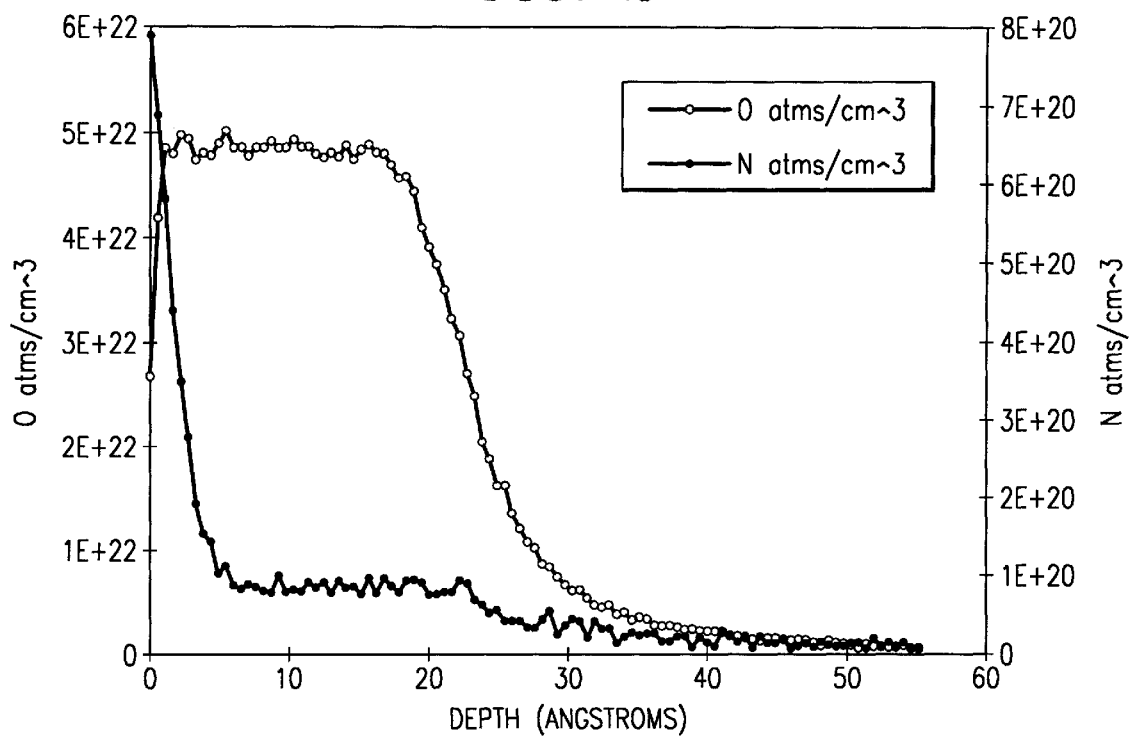
FIG. 2 is a concentration profile of oxygen and nitrogen in a 22 Å dielectric grown in $N_2O+H_2$ at 1050° C.

A variety of tools may be used to form ultra-thin dielectric 14. For example, joule heated furnaces, lamp heated rapid thermal processors and joule heated rapid thermal processors may be used. However, in the preferred embodiment, a cold wall tool, such as a cold wall lamp heated RTP tool, is used. The use of a cold wall tool prevents the decomposition of the $N_2O$ molecule anywhere but on the wafer surface. The presence of $H_2$ in the oxidation ambient prevents nitrogen incorporation at the interface. The process results in a nitrogen incorporation of less than 5E13 at/cm² on a 22 Å film, as shown in FIG. 2.

Figure 3:
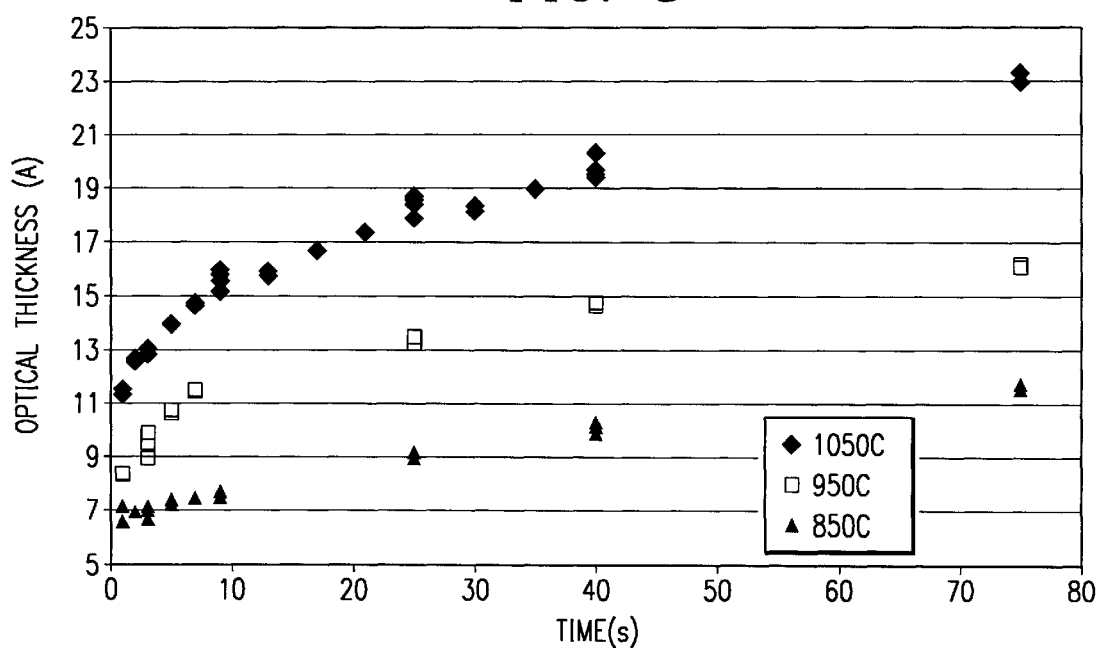
FIG. 3 is a graph of growth curves for $N_2O+H_2$ oxidation at various temperatures.
Figure 4:
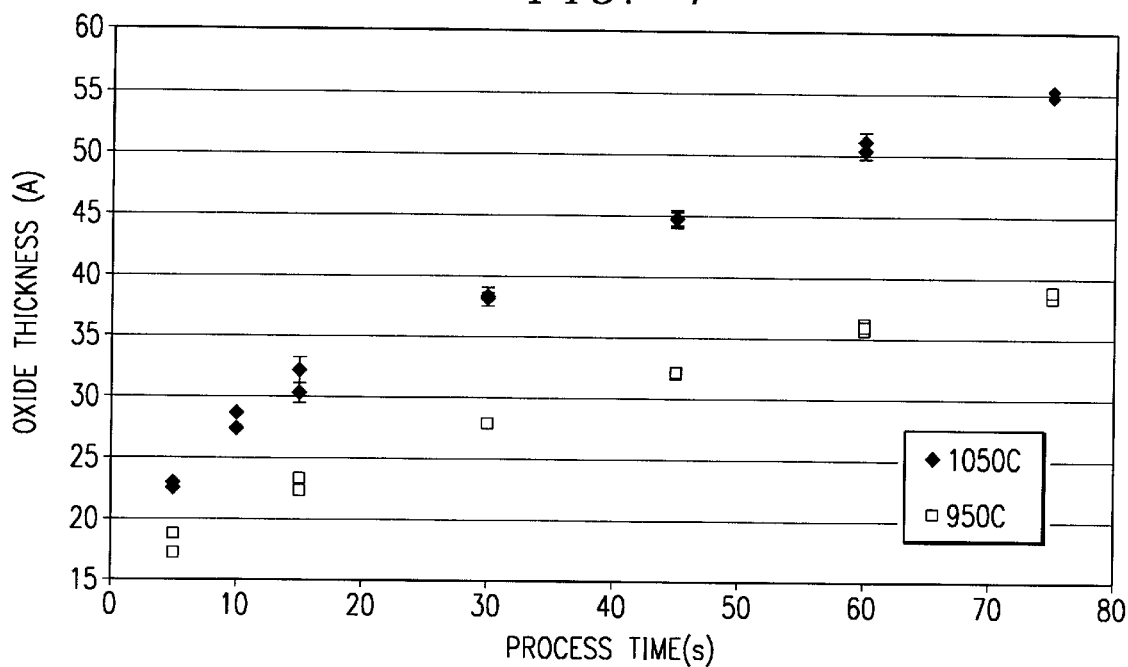
FIG. 4 is a graph of growth curves for $O_2+H_2$ oxidation at various temperatures.

The above process is able to use a temperature in the range of 850° C.–1150° C. Prior art processes using $O_2$ needed to reduce the temperature to below 850° C. and diluted the oxidant concentration. Temperatures above 900° C. resulted in uncontrolled and non-uniform growth in the prior art $O_2$ process. However, when $N_2O$ is used as the oxidant, the temperature can be increased while maintaining good uniformity and controlled growth down to 10 Å. For example, a $SiO_2$ film of 11 Å can be grown at 1050° C. Less than 8 Å can be grown at a temperature of 950° C. FIG. 3 shows the growth curves for $N_2O+H_2$ oxidation (oxide thickness versus time) at various temperatures. FIG. 4 shows the growth curves for oxidation in $O_2+H_2$. High temperatures are desirable because they result in a thinner interfacial layer (between the dielectric and the substrate). A thin interfacial layer improves the electrical properties of the dielectric.

Figure 1C:
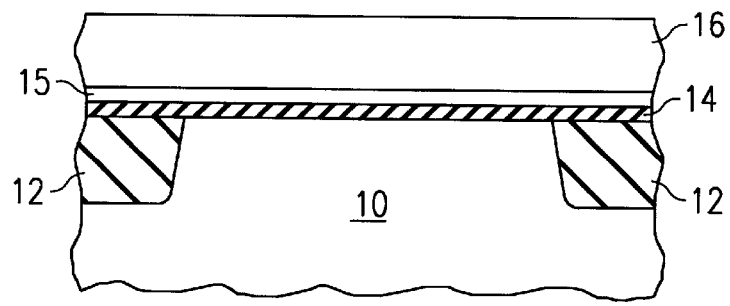

After forming the ultra-thin gate dielectric 14, a high-k dielectric 15 may optionally be deposited on top of ultra-thin dielectric 14. High-k dielectrics are typically defined as those dielectrics having a dielectric constant greater than silicon dioxide (e.g., >4.0). Examples include silicates, such as Hf silicate or Zr silicate. The gate electrode material 16 is deposited as shown in FIG. 1C. Typically, the gate electrode material comprises polysilicon. For example, gate electrode material 16 may comprise a layer of polysilicon, a barrier layer (e.g., WN or WSiN), and a metal layer (e.g., W). Alternative gate structures are well known in the art.

Figure 1D:
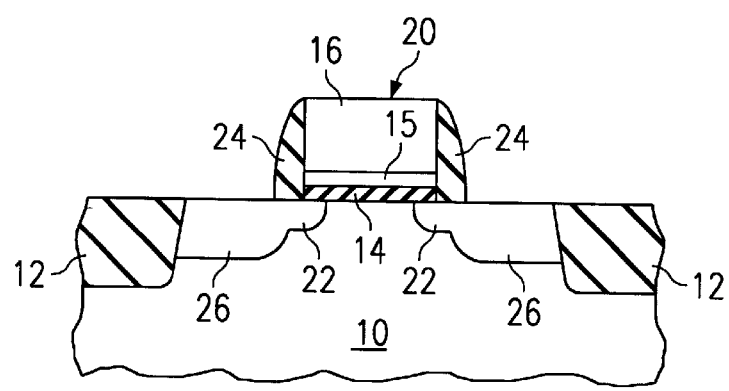

Gate electrode material 16, optional high-k dielectric 15, and gate dielectric 14 are then patterned and etched to form gate structure 20, as shown in FIG. 1D. Drain extension regions 22, sidewall spacers 24, and source/drain regions 26 may then be formed. It should be noted that many compatible methods are known in the art for completing the formation of transistor 30 and may be used without departing from the scope of the invention.

The $N_2O$ oxidation according to the invention results in uniform and controllable growth. The table below shows the target thickness, 3-sigma variation and average thickness for various lots process according to the invention. The process conditions were $N_2O+1\%\ H_2$ at a pressure of 12 torr and a temperature of 1050° C.

| Target | 3 Sigma | Average | Cp | Cpk |
|--------|---------|---------|-------|-------|
| 18Å | 1.0Å | 17.66 | 1.027 | 0.676 |
| 18Å | 1.5Å | 17.66 | 1.540 | 1.189 |
| 18Å | 2.0Å | 17.66 | 2.053 | 1.702 |
| 15Å | 1.0Å | 14.92 | 1.051 | 0.964 |
| 15Å | 1.5Å | 14.92 | 1.577 | 1.490 |
| 15Å | 2.0Å | 14.92 | 2.103 | 2.016 |

Figure 5:
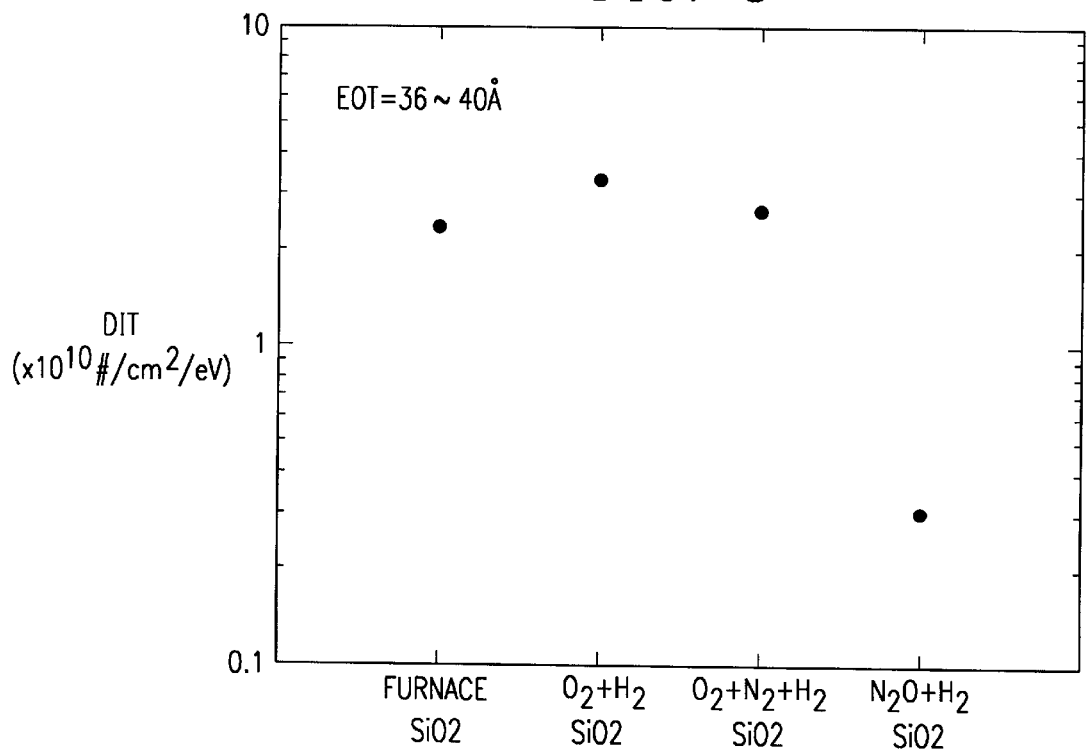
FIG. 5 is a graph of the density of interface states for various oxidation methods.
Figure 6:
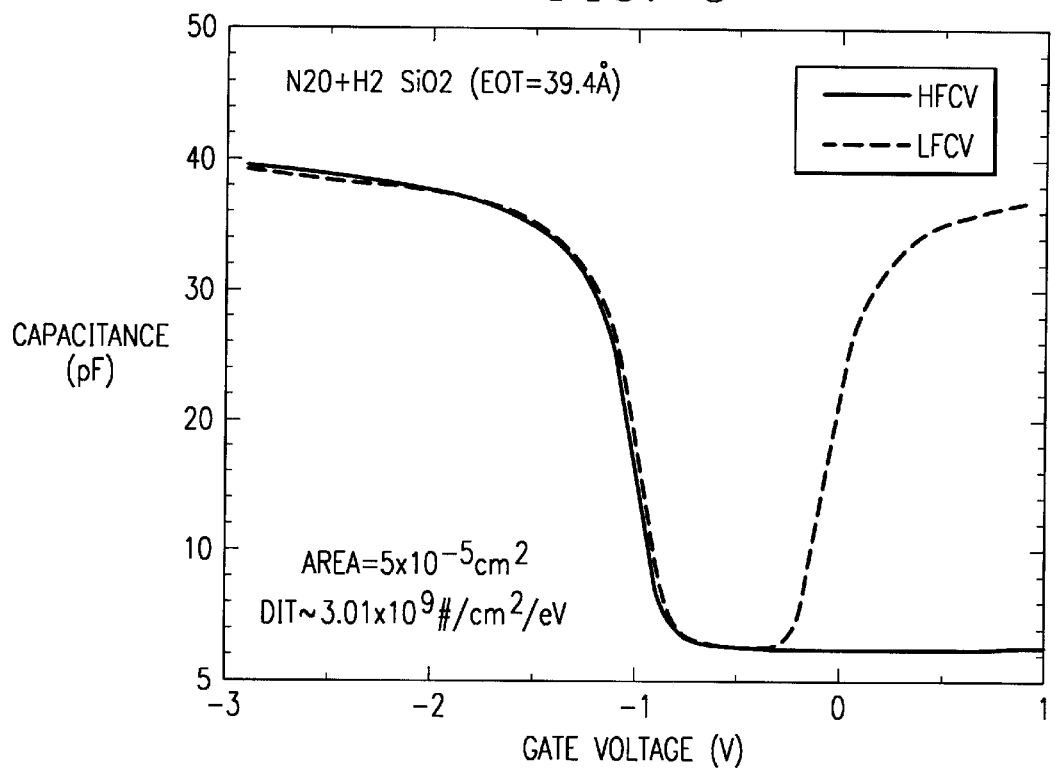
FIG. 6 is a graph of a CV curve for a 40 Å oxide formed according to an embodiment of the invention.

$SiO_2$ films, such as gate dielectric 14, formed using $N_2O+H_2$ have an order of magnitude lower density of interface states (Dit) compared to oxides fabricated by conventional dry $O_2$ furnace and $O_2+H_2$ methods. Dit for the various methods are shown in FIG. 5 for an equivalent oxide thickness (EOT) of 36–40 Å. FIG. 6 is a typical CV curve from where the low Dit values for the $N_2O+H_2$ oxides were extracted.

Figure 7:
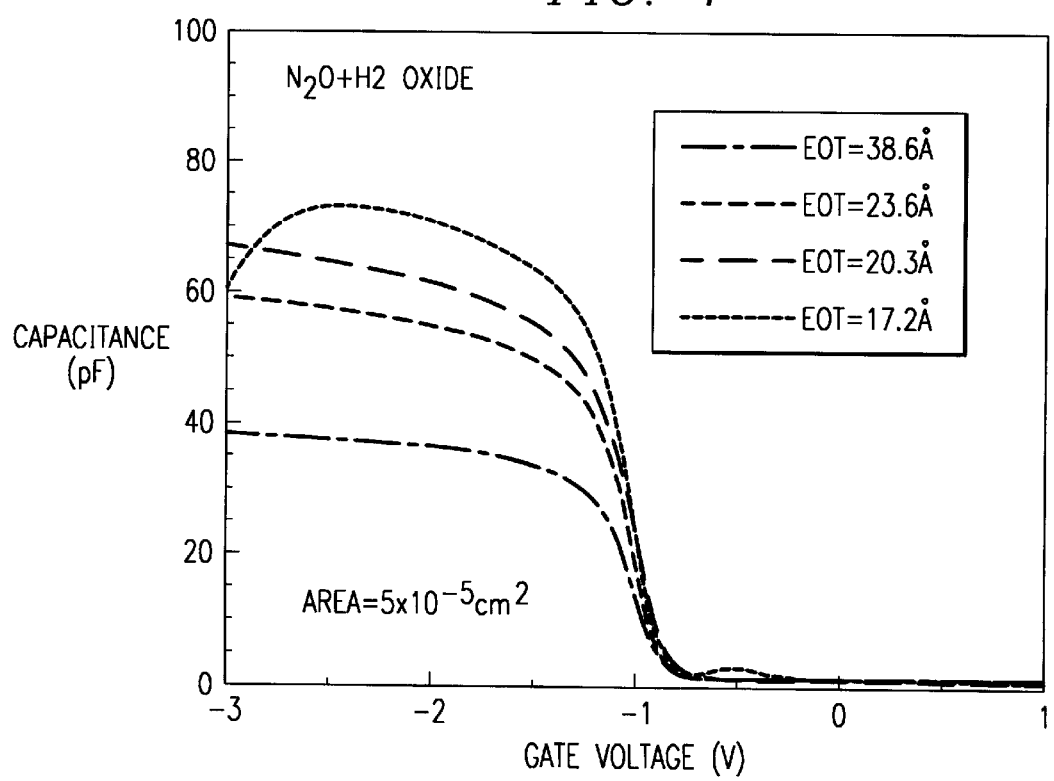
FIG. 7 is a graph of CV curves for 38 Å–17 Å oxides formed according to the embodiment of the invention.

The CV curves of $N_2O+H_2$ oxides of different thickness (38 Å to 17 Å) are shown in FIG. 7. Small changes in flatband voltage indicate that the films have negligible fixed charges.

Figure 8:
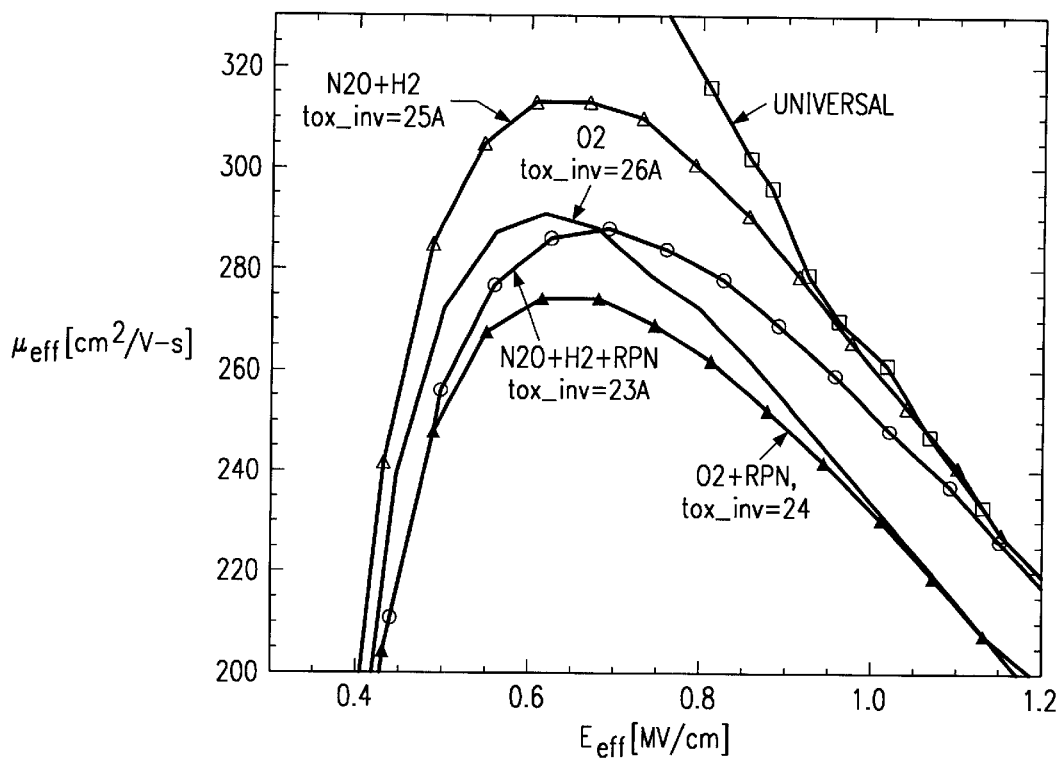
FIG. 8 is a graph of mobility curves for various oxidation methods.
Figure 9:
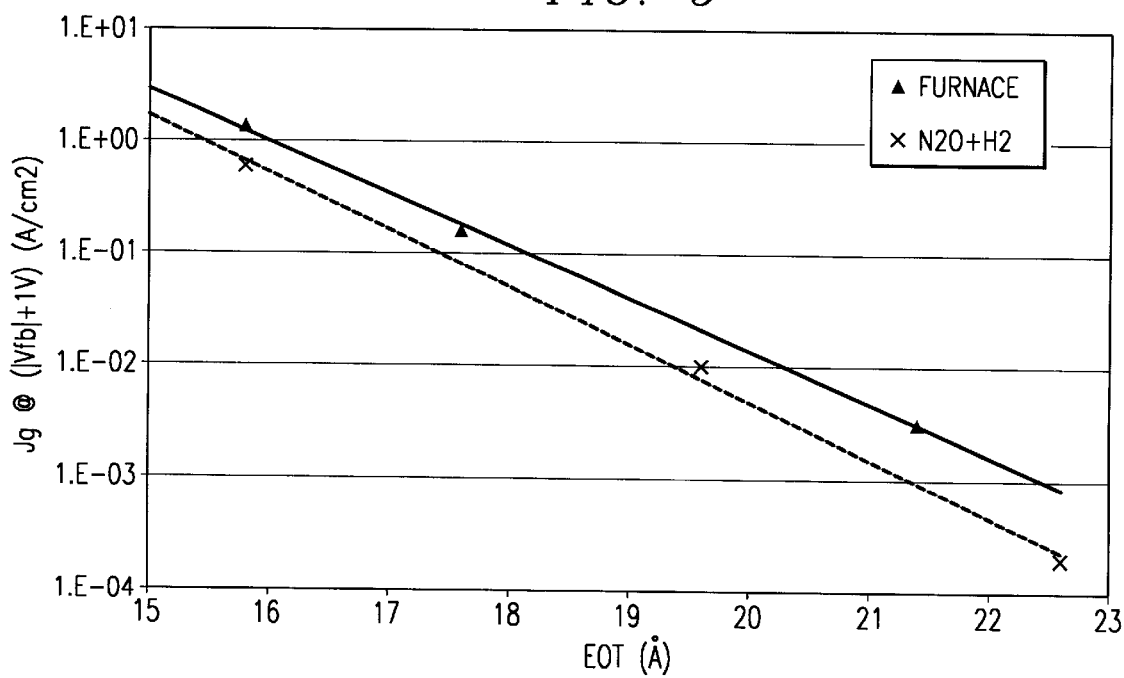
FIG. 9 is a graph of the gate leakage current density at 1V above flatband as a function of the equivalent oxide thickness on capacitors with dielectrics formed by various oxidation methods.

Moreover, the peak mobility of transistors 30 fabricated according to the invention, lies on the universal mobility curve, being 9% higher than the one obtained with conventional $O_2$ furnace methods, as shown in FIG. 8. Finally, the dielectrics grown according to the invention result in a 2× reduction in gate leakage versus furnace dry $O_2$ grown oxides of the same equivalent electrical thickness, as can be seen in FIG. 9.

While this invention has been described with reference to illustrative embodiments, this description is not intended to be construed in a limiting sense.

Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating an integrated circuit, comprising the steps of:

growing an oxide layer over a semiconductor body using $N_2O$ with hydrogen added at a given concentration to improve the electrical properties of the oxide layer.

2. The method of claim 1, wherein said oxide layer has a thickness in the range of 7 Å–22 Å.

3. The method of claim 1, wherein the step of growing the oxide layer occurs at a temperature greater than 850° C.

4. The method of claim 1, wherein the step of growing the oxide layer occurs in a cold wall rapid thermal process tool.

5. The method of claim 1, wherein said oxide layer forms a gate dielectric of a transistor.

6. The method of claim 1, wherein the step of growing the oxide layer occurs in a joule heated tool.

7. The method of claim 1, wherein a high-k dielectric film is deposited on the oxide layer to form a gate dielectric.

8. A method of fabricating an integrated circuit comprising the step of:

growing an oxide layer using $N_2O$ as the oxidant in a cold wall rapid thermal process tool, with a hydrogen concentration of 1% or less.

9. The method of claim 8, wherein said oxide layer has a thickness in the range of 7 Å–22 Å.

10. The method of claim 8, wherein the step of growing the oxide layer occurs at a temperature greater than 850° C.

11. The method of claim 8, wherein the step of growing the oxide layer further comprises adding 1% hydrogen to an ambient in the cold wall rapid thermal process tool.

12. The method of claim 8, wherein said oxide layer forms a gate dielectric of a transistor.

13. The method of claim 8, wherein a high-k dielectric film is deposited on top of the oxide layer to form a gate dielectric.

* * * * *